United States Patent [19]
Itani

[11] Patent Number: 6,033,827
[45] Date of Patent: Mar. 7, 2000

[54] CHEMICALLY AMPLIFIED RESIST

[75] Inventor: Toshiro Itani, Tokyo, Japan

[73] Assignee: NEC Corporation, Tokyo, Japan

[21] Appl. No.: 09/036,997

[22] Filed: Mar. 9, 1998

[30] Foreign Application Priority Data

Mar. 11, 1997 [JP] Japan .................................... 9-056357

[51] Int. Cl.[7] .................................................. G03F 7/004
[52] U.S. Cl. ........................ 430/270.1; 430/905; 430/910
[58] Field of Search ................................ 430/270.1, 905, 430/910

[56] References Cited

U.S. PATENT DOCUMENTS

| | | | |
|---|---|---|---|
| 5,230,984 | 7/1993 | Tachiki et al. | 430/270.1 |
| 5,258,257 | 11/1993 | Sinta et al. | 430/192 |
| 5,419,998 | 5/1995 | Mayes et al. | 430/288.1 |
| 5,635,332 | 6/1997 | Nakano et al. | 430/270.1 |
| 5,837,419 | 11/1998 | Ushirogouchi et al. | 430/270.1 |

FOREIGN PATENT DOCUMENTS 5323610  12/1993  Japan .............................. G03F 7/039

OTHER PUBLICATIONS

"Positive Chemically Amplified Resist for ArF Excimer Laser Lithography COmposed of a Novel Transparent Photoacid Generator and an Alicyclic Terpolymer"; Nakano et al; Proceedings of the Society of Photo–opticl Instrumentation Engineers, vol. 2438; pp. 433–444; Jun. 1995.

*Primary Examiner*—John S. Chu
*Attorney, Agent, or Firm*—Hayes, Soloway, Hennessey, Grossman & Hage PC

[57] ABSTRACT

To provide chemically amplified resist which is excellent in resolution, focusing and size accuracy as well by eliminating problem of the tapered resist pattern owing to the photo-absorption, and gives, at the same time, high thermal stability and sufficient resistance against dry-etching, resin having an aromatic ring is added in chemically amplified resist comprising a alicyclic acrylic polymer and a photoacid generator. As to the resin having the aromatic ring, it is preferably a polyhydroxystyrene polymer, a novolac polymer or a t-BOC protected polyhydroxystyrene polymer. Preferable additive amount of these polymers is 1 to 10 parts by weight to 100 parts of base polymer.

4 Claims, 1 Drawing Sheet

CHEMICALLY AMPLIFIED RESIST

BACKGROUND OF THE INVENTION

The present invention relates to chemically amplified resist including an alicyclic acrylic polymer and a photoacid generator, and added resin having an aromatic ring, which is usable as positive resist, for example, to be applied to pattern formation wherein the positive resist is formed on a semiconductor substrate, exposed to ArF excimer laser light projected through a mask or a reticle, processed with PEB (Post Exposure Bake), and developed with a developer.

In conventional photolithography technique, a solubility-suppressed positive resist wherein a novolac polymer is used as a base polymer with added naphthoquinonediazido as a photosensitive is exposed to g-ray (436 nm) or i-ray (365 nm). However, lithography applying far ultraviolet rays such as excimer laser light of 248 nm or 193 nm has become required along with progress of fine integration of semiconductor circuits. As for the excimer laser light, the above conventional resist is not convenient because of its too strong photo-absorption to obtain a good resist pattern together with its too amplified photosensitivity. Hence, the chemically amplified(l resist making use of an acid catalyst obtained from a photoacid generator (hereafter abbreviated as PAG) is proposed as a resist material for the short-wave lithography or the electron beam lithography requiring high sensitivity.

However, problem of the photo-absorption is serious for resist material to be applied to ArF excimer laser lithography of 193 nm exposure light, and so, components of the resist material are severely restricted. As to chemically amplified resist for ArF excimer laser, there has been proposed two-component positive resist consisting of alicyclic acrylic polymer, having no problem of the photo-absorption, and a PAG, (for example, by Nakano et al., in a paper "Positive Chemically Amplified Resist for ArF Excimer Laser Lithography Composed of a Novel Transparent Photoacid Generator and an Acrylic Terpolymer", in Proceedings of the Society of Photo-optical Instrumentation Engineers, vol. 2438, pp. 433–444). However, this two-component positive resist was not practical because of its low thermal stability and very poor resistance against dry-etching to be performed for etching a base film according to a resist pattern developed thereon.

As for resist material having improved thermal stability and resistance against dry-etching, chemically amplified resist consisting of a phenolic polymer and a PAG and further including a crossing agent is proposed in a Japanese patent application laid open as a Provisional Publication No. 323610/'93. However, with this resist material having strong photo-absorption to ArF excimer laser, rectangle cross section of the resist pattern cannot be obtained and a resist pattern 202 developed on a wafer 201 becomes tapered, as schematically illustrated in FIG. 2. This tapered resist pattern is fatal especially for fine pattern configuration, degrading resolution, focusing and size accuracy.

SUMMARY OF THE INVENTION

Therefore, a primary object of the present invention is to provide a chemically amplified resist which is excellent in resolution, focusing and size accuracy as well as eliminating the problem of the tapered resist pattern owing to the photo-absorption, and gives, at the same time, high thermal stability and sufficient resistance against dry-etching, thereby resolving the above problems of the prior art.

In order to achieve the object, the chemically amplified resist of the invention comprises an alicyclic acrylic polymer, a photoacid generator, and a resin having an aromatic ring.

By adding the resin having the aromatic ring, which improves thermal stability and resistance against dry-etching, onto conventional two component chemically amplified resist composed of an alicyclic acrylic polymer, which has no problem of photo-absorption for ArF excimer laser light and a PAG, a resist material most suitable for the ArF excimer laser lithography is realized maintaining both of the above characteristics in good balance. Carbon atoms and double bonds among them included in the aromatic ring improve the thermal stability and restrain wearing of the resist film against dry-etching.

BRIEF DESCRIPTION OF THE DRAWINGS

The foregoing, further objects, features, and advantages of this invention will become apparent from a consideration of the following description, the appended claims, and the accompanying drawings wherein:

DETAILED DESCRIPTION OF THE PREFERRED EMBODIMENTS

Figure 1:
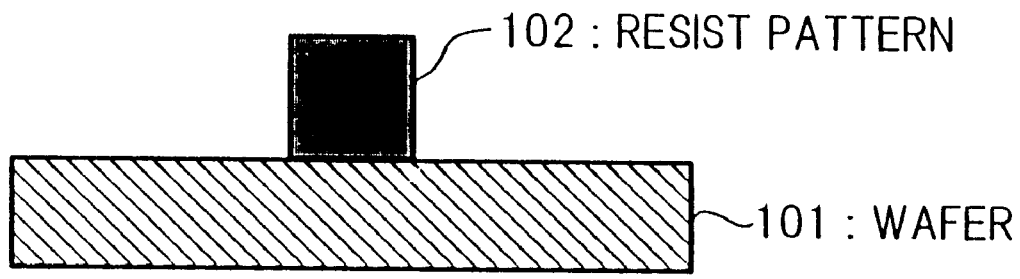
FIG. 1 is a cross section schematically illustrating the positive resist pattern obtained with at first example of chemically amplified resist according to an embodiment of the invention.
Figure 2:
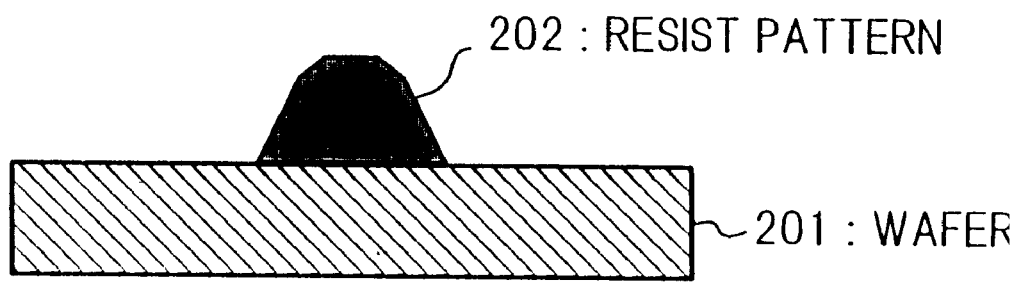
FIG. 2 is a cross section schematically illustrating a tapered resist pattern 202 developed on a wafer 201 with conventional chemically amplified resist.

Now, a preferred embodiment of the present invention will be described.

In the chemically amplified resist of the invention, an alicyclic acrylic polymer is used for a base polymer.

As to the alicyclic acrylic polymer, conventional resin used for the base polymer of the chemically amplified resist such as an alicyclic methacrylate polymer or alicyclic acrylate polymer having polar groups may be used. A concrete example is a poly(TCDA-THMPA-MAA: tricyclo [$5.2.1.0.^{2,6}$] decanylacrylate-co-tetrahydropyranylmethacrylate-co-methacrylic acid described in the previous paper by Nakano et al.

As to a PAG to be added to the chemically amplified resist of the invention, conventional PAGs such as onium salt or disulfonyldiazomethane PAG, for example, may be applied, the kind and amount thereof being determined in accordance with the purpose. In general, 1 to 10 parts by weight of PAG are to be added to 100 parts by weight of the base polymer.

The chemically amplified resist of the invention is characterized in that it includes resin having an aromatic ring.

As to the resin having an aromatic ring, the kind or kinds and amount are not limited, on condition that carbon atoms and double bonds among them included in the aromatic ring should function to improve the thermal stability and to restrain wearing of the resist film against dry-etching. Preferable average molecular weight is 8,000 to 30,000, in styrene-conversion measured by GPC (Gas Permeation Chromatography)

A most, preferable resin having the aromatic ring is a polyhydroxystyrene polymer having following formula (1):

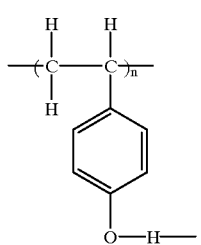

(1)

Other preferable resins having the aromatic ring, include a novolac polymer having following formula (2), or a polyhydroxy-styrene polymer provided with a protection group of little alkali-solubility represented by a t-BOC (t-butoxycarbonyl) protected polyhydroxystyrene polymer having following formula (3), can be used.

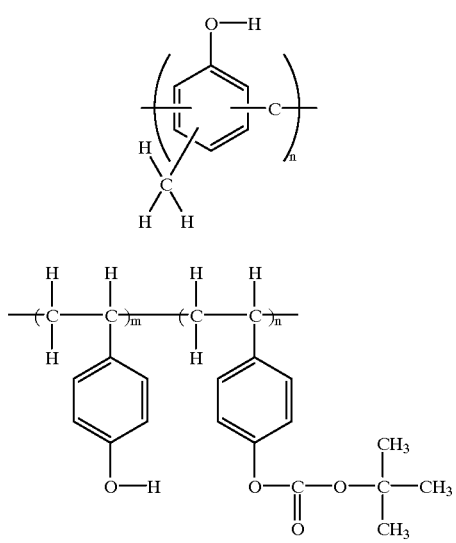

These polymers having the aromatic ring are preferably to be added 1 to 10 parts by weight to 100 parts by weight of the base polymer, the alicyclic acrylic polymer.

It is to be noted, here, that these polymers have different alkali-solubility with each other, giving different effect to the resolution or the cross-sectional pattern of the resist. Therefore, it is preferable to select appropriate kind or kinds, molecular-weight ratio, mixture ratio and protection coefficient of the resin to he added, according to composition of the base polymer. In other words, by selecting these factors appropriately, the thermal stability and the resistance against dry-etching can be improved while maintaining a most appropriate solubility-contrast as well, which is most important for the resist resolution.

Furthermore, the resin having the aromatic ring has strong absorption at ArF excimer laser wavelength of 193 nm. Therefore, by selecting appropriate kind or kinds, molecular-weight ratio or amount to be added of the resin, it may also function as a dye. For the purpose, transparency of the resist film for the 193 nm is preferably 40 to 70%/$\mu$m, and most preferably 50%/$\mu$m. By thus preparing the resist, photo-absorption giving effective reflection-prevention can be obtained, suppressing resist pattern deformation because of diffused reflection from the base substrate, and consequently, suppressing the resolution degradation.

Still further, to the chemically amplified resist of the invention, a crosslinking agent or other additive material may be added optionally.

In the following paragraphs, some examples and experimental results of the embodiment are described.

As a first example of the embodiment, a liquid of the chemically amplified resist for ArF excimer laser is prepared, comprising 100 parts by weight of poly(TCDA-THPMA-MAA) of 20,000 average molecular weight as the base polymer, 5 parts by weight of onium salt as the PAG, 2 parts by weight of polyhydroxystyrene of 12,000 average molecular weight as the resin having the aromatic ring, and 80 parts by weight of PGMEA (polypropyleneglycolmonomethyletheracetate) as the solvent.

This chemically amplified resist liquid is applied on a silicon wafer with a thickness of 0.5 $\mu$m, which is exposed to ArF excimer laser of 193 nm focused through a mask, processed with PEB of 100° for 90 sec., and developed with alkali developer, and a positive resist pattern with rules of 0.18 $\mu$m width is obtained.

FIG. 1 is a cross section schematically illustrating the positive resist pattern thus obtained with the first example of the chemically amplified resist according to the embodiment, wherein a rectangular resist pattern 102 developed on a wafer 101 is realized with excellent resolution and size accuracy.

With this positive resist pattern, dry-etching is then performed making use of $CL_2HBr$ gas, in 100 mm Torr with 120 W for 120 sec., and a good etching result is obtained without wearing of the resist film or deformation of the resist pattern. That is, about 10% improvement is obtained in the thermal stability and the resistance against dry-etching compared to a following comparison example.

As a comparison example, a chemically amplified resist liquid having the same composition with the first example of the embodiment is prepared except that no polyhydroxystyrene polymer is added, dry-etching is performed with a resist pattern obtained therefrom in the same way, wherein wearing of the resist film and deformation of the resist pattern are found.

As to a second example wherein only the resin having the aromatic ring of the first example is replaced with 1 part by weight of polyhydroxystyrene of 20,000 molecular weight, the same good result is obtained in the same way with the first example.

As heretofore described, wearing of the resist film is suppressed in the dry-etching and the thermal stability can be improved in the ArF lithography using the chemically amplified resist of the invention which includes a resin having an aromatic ring. Hence, deformation of the resist pattern in the post exposure baking or the dry-etching is suppressed and high resolution is obtained. Further, the resin having the aromatic ring functions as a dye.

Therefore, resolution, focusing and size accuracy of lithography can be improved according to the present invention, enabling still fine integration of the device pattern. In other words, the chemically amplified resist of the invention is very effective for configuring an ultra-fine pattern and makes a certain contribution to high performance or fine resolution of the lithography resist.

What is claimed is:

1. Chemically amplified resist comprising an alicyclic acrylic polymer and a photoacid generator, wherein resin having an aromatic ring and a molecular weight between 8,000 and 30,000 is added.

2. The chemically amplified resist recited in claim 1, said resin having an aromatic ring being at least one of a novolac polymer and a polyhydroxystyrene polymer.

3. The chemically amplified resist recited in claim 1, said resin having an aromatic ring being a polyhydroxystyrene polymer having a protection group of little alkali-solubility.

4. The chemically amplified resist recited in claim 1, wherein 1 to 10 parts by weight of the resin having an aromatic ring is added to 100 parts by weight of the alicyclic acrylic polymer.

* * * * *